United States Patent [19]

Lee

[11] 3,996,539
[45] Dec. 7, 1976

[54] SINGLE AMPLIFIER NETWORK FOR SIMULATING A SUPER-INDUCTOR CIRCUIT

[75] Inventor: Man Shek Lee, Belmont, Calif.

[73] Assignee: GTE Automatic Electric Laboratories Incorporated, Northlake, Ill.

[22] Filed: Dec. 24, 1975

[21] Appl. No.: 644,279

[52] U.S. Cl. .......................... 333/80 R; 333/80 T
[51] Int. Cl.² ........................................ H03H 7/44
[58] Field of Search ........................ 333/80 R, 80 T

[56] References Cited
UNITED STATES PATENTS

| | | | |
|---|---|---|---|
| 2,968,773 | 1/1961 | Sandberg | 333/80 T |
| 3,219,952 | 11/1965 | Saraga | 333/80 R |
| 3,831,117 | 8/1974 | Fletcher | 333/80 R |
| 3,895,309 | 7/1975 | Rollett et al. | 333/80 R |

Primary Examiner—Harold A. Dixon
Attorney, Agent, or Firm—Russell A. Cannon; Leonard R. Cool

[57] ABSTRACT

The one-port network here includes a pair of terminals and a single differential-input operational amplifier having an output electrically connected through the series combination of a resistor R3 and capacitor C3 to a first input of the amplifier, through a resistor R4 to the second input of the amplifier, and through a resistor R7 to one terminal of the network. The first and second inputs to the amplifier are also electrically connected through an associated resistor R1 and capacitor C2 to the one network terminal. The other network terminal is connected to a ground reference potential and through resistors R5 and R6 to the first and second inputs, respectively, of the amplifier. With normalized values of network elements satisfying prescribed criteria, the impedance presented across the network terminals corresponds to that of the series combination of a super-inductor, an inductor, and a resistor. By proper selection of element values, the impedance simulated across the network port may be adjusted to correspond to that of a resistor alone or in series with an inductor, or these two elements individually in series with a super-inductor.

8 Claims, 2 Drawing Figures

SINGLE AMPLIFIER NETWORK FOR SIMULATING A SUPER-INDUCTOR CIRCUIT

BACKGROUND OF INVENTION

This invention relates to simulation networks and more particularly to a network for simulating a circuit including a superinductor.

In order to provide high-quality filters for use in integrated circuit applications, simulation networks are employed to replace filter inductors with other elements that can be more easily fabricated with integrated circuit techniques. Consider a prior-art bandpass filter network having a highpass section including a pair of series capacitors and the series combination of an inductor and a capacitor connected between the junction of the pair of capacitors and ground. One way of realizing this prior-art filter network is to transform it to a topologically similar network by scaling impedances by the complex frequency parameter s and making use of the concept of a super-inductor which is designated by the parameter X (where $Z(s) = s^2 X$), see "Aktive Bandfilter minimaler Kondensatoren mit Impedanzkonvertern" by Klaus Panzer, Munich, NTZ 1974, Heft 10, pp. 379 – 382 (Nachrichtentechnische Zeitschrift 27 (1974)). Under this transformation, the capacitors become resistors and the inductor becomes a super-inductor. The networks disclosed in the Panzer article for realizing a super-inductor require two differential input amplifiers.

An object of this invention is the provision of an improved network for simulating electrical elements.

DESCRIPTION OF DRAWING

This invention will be more fully understood from the following detailed descriptions of preferred embodiments thereof, reference being had to the drawing in which.

DESCRIPTION OF PREFERRED EMBODIMENTS

Figure 1:
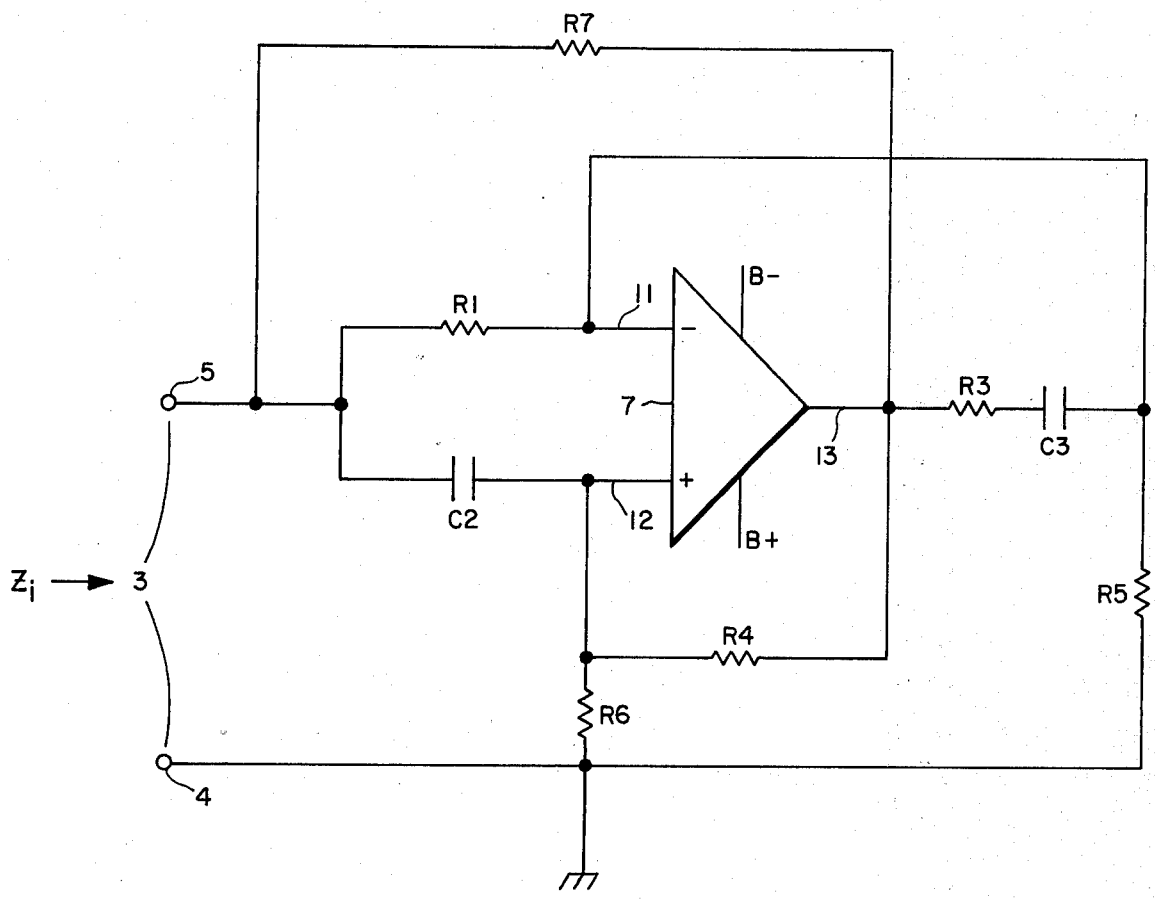
FIG. 1 is a schematic circuit diagram of a simulation network embodying this invention.
Figure 2:
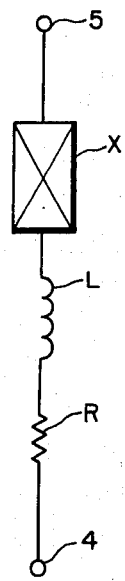
FIG. 2 is a schematic representation of the circuit elements simulated by the network in FIG. 1 across the one port thereof.

The network in FIG. 1 comprises a single port 3 including a pair of terminals 4 and 5, a single amplifier 7, a pair of capacitors C2 and C3, and a plurality of resistors. The same reference characters (e.g., R5) are employed in this description to designate both the element itself and the element value (e.g., the resistance thereof). The context in which a reference character is employed clearly indicates what is designated thereby.

The amplifier 7 is a differential-input operational amplifier. This amplifier 7 is considered in the following description to be an ideal amplifier with zero output impedance, infinite input impedance, and infinite voltage gain. Although such an ideal amplifier does not exist in practice, this does not seriously affect the design of this circuit. A non-ideal 7 merely introduces extraneous terms in the impedance $Z_i$ simulated across the network terminals 4 and 5 which can be compensated for, in a manner well known in the art, in order to produce the desired impedance $Z_i$ across port 3.

One network terminal 4 is electrically connected to a ground reference potential. The other network terminal 5 is electrically connected through a resistor R1 and the capacitor C2 to input lines 11 and 12, respectively, of the amplifier. The lines 11 and 12 are preferably connected to the negative and positive inputs, respectively, of the amplifier 7. These connections may be reversed in most instances, however, and the network still operates satisfactorily. The actual polarity of the amplifier input connections is selected to ensure that the network is DC stable. This is accomplished by making the negative feedback here greater than the positive feedback in a manner well known in the art. This connection may also be affected by whatever resistance path is connected across the terminals 4 and 5. Terminals of the amplifier are also connected to a supply voltage in a manner well known in the art. The output line 13 of the amplifier is electrically connected through the series combination of a resistor R3 and capacitor C3 to the input line 11, and through a resistor R4 to the other input line 12. These input lines 11 and 12 are also connected through resistors R5 and R6, respectively, to ground. The output line 13 is also connected through a resistor R7 to the network terminal 5.

Consider that the values of capacitance and resistance of network elements are normalized and are expressed in terms of farads and ohms, respectively. Solving the node equations for the network, and requiring that the resistances of elements here satisfy the relationships $$C2\ C3(g3\ g6 - g4\ g5 - g5\ g7) = 0 \qquad (1)$$

and
$$C3(g1(g3\ g6 - g4\ g5) + g7(g3\ g6 - g4\ g5 + g1\ g6)) - C2\ g3\ g5(g4 + g7) = 0, \qquad (2)$$

where g represents the conductance of an associated resistor, the impedance $Z_i$ looking into port 3 is representable as $$Z_i = s^2 X + sL + R = s^2(a2/b0) + s(a1/b0) + (a0/b0) \qquad (3)$$

where $$a2 = g3\ C2\ C3 \qquad (4)$$

$$a1 = C3(g3\ g6 - (g1 + g5)g4) \qquad (5)$$

$$a0 = -g3\ g4(g1 + g5) \qquad (6)$$

and $$b0 = g1\ g3(g6\ g7 - g4\ g5) - g3\ g4\ g5\ g7. \qquad (7)$$

This impedance $Z_i$ corresponds to the series combination of a superinductor X, an inductor L, and a resistor R (having a negative resistance) electrically connected in series between the network terminals 4 and 5. By suitable selection of element values, either a resistor R alone or in series with an inductor L, or these two simulated elements R and L individually in series with a super-inductor X, or the series combination of all three of these elements X, L, and R may be simulated across the network port 3. Also, the values of the simulated elements may be positive or negative.

The simulated super-inductor $X$, inductor $L$, and resistor $R$ vanish when $$a2 = 0 \text{ for } C2 = 0 \qquad (8)$$

$$a1 = 0 \text{ for } g3\ g6 = g4(g1 + g5) \qquad (9)$$

and $$a0 = 0 \text{ for } g4 = 0, \qquad (10)$$

respectively. By selecting element values to satisfy equations (1) and (2) and different ones of the equations (8), (9), and (10), the series combination of a super-inductor and an inductor, a super-inductor and a resistor, and an inductor and a resistor is simulated across port 3. The network simulates a negative resistance alone across port 3 when element values satisfy equations (1) and (2) and make both $a2 = 0$ and $a1 = 0$.

The simulated super-inductance has the same sign as does $b0$, since $a2$ must be positive. The simulated inductance $L$ is positive when $a1$ and $b0$ are both of the same sign and is negative when they are of opposite sign. The simulated resistor has a negative resistance when $b0$ is positive and has a positive resistance when $b0$ is negative.

In order to simulate the series combination of a particular super-inductor $X$, inductor $L$, and resistor $R$ across port 3, values of network elements are selected to satisfy the requirements in equations (1) and (2) and the definitions of the simulated elements in equations (3) – (7). In practice, desired values of the simulated super-inductor, inductor, and resistor are selected. Normalized values of the network elements are also selected so as to satisfy equations (1) – (7) for the previously selected values of the simulated super-inductor, inductor, and resistor. Finally, the normalized values of the network elements are denormalized to practicable values of corresponding elements which are physically realizable in an actual circuit. By way of example, the series combination of a super-inductor and a resistor having a negative resistance is simulated across port 3 if values of network elements satisfy the definitions:

$$Z_i = s^2 X - R, \quad (11)$$

$$g1/2 = g3 = 2g4 = g5 = 2g6/3 = g7 = 1/R \quad (12)$$

$$C2 = 4C3 = \sqrt{6X}. \quad (13)$$

What is claimed is:

1. An active, one-port simulation network for simulating a super-inductor $X$, an inductor $L$, and a resistor $R = 1/G$ electrically connected in series across the pair of terminals of the network port, comprising:
   a differential-input operational amplifier having first and second input lines electrically connected to associated input terminals of the amplifier which are of opposite polarity and having an output line;
   a resistor R1 electrically connected in series between one network terminal and said first input line;
   a capacitor C2 electrically connected between the one network terminal and said second input line;
   a resistor R3 and capacitor C3 electrically connected in series between said output line and said first input line;
   a resistor R4 electrically connected between said output line and said second input line;
   a resistor R5 electrically connected between said first input line and the other network terminal which is connected to a ground reference potential;
   a resistor R6 electrically connected between said second input line and the other network terminal;
   a resistor R7 electrically connected between said output line and the one network terminal;
   normalized values of the capacitance of said capacitors and the resistance of said resistors and said simulated elements satisfying the requirements that $$C2\ C3(g3\ g6 - g4\ g5 - g5\ g7) = 0$$

and $$C3(g1\ (g3g6 - g4\ g5) + g7(g3\ g6 - g4\ g5 + g1\ g6)) - C2\ g3\ g5(g4 + g7) = 0$$

where $g$ represents the conductance of a particular one of said resistors, the impedance $Z_i$ looking into the network port satisfying the relationships $$Z_i = s^2 X + sL + R$$

where $X = a2/b0$, $L = a1/b0$, and $R = a0/b0$, and $a2 = g3\ C2\ C3$ $a1 = C3(g3\ g6 - (g1 + g5)g4)$ $a0 = -g3\ g4(g1 + g5)$ and $b0 = g1\ g3(g6\ g7 - g4\ g5) - g3\ g4\ g5\ g7.$ 2. The simulation network according to claim 1 including only a single amplifier.

3. The simulation network according to claim 2 wherein the values of said resistors and capacitors satisfy the requirement that $g4 = 0$ for causing $a0 = 0$, the network now simulating a super-inductor and an inductor in series across the network port.

4. The simulation network according to claim 2 wherein the values of said resistors and capacitors satisfy the requirement that $g3\ g6 = g4(g1 + g5)$ for causing $a1 = 0$, the network now simulating a super-inductor and a resistor $R$ in series across the network port.

5. The simulation network according to claim 4 wherein the simulated resistor has a frequency-independent negative resistance.

6. The simulation network according to claim 2 wherein the values of said resistors and capacitors satisfy the requirement that $C2 = 0$ for causing $a2 = 0$, the network now simulating an inductor and a resistor in series across the network port.

7. The simulation network according to claim 4 where the values of said resistors and capacitors satisfy the requirement that $C2 = 0$ for causing $a2 = 0$, the network now simulating a resistor alone having a frequency-independent negative resistance across the network port.

8. The simulation network according to claim 7 where the values of said resistors and capacitors satisfy the requirement that $g1\ g3\ g6\ g7 > g3\ g4\ g5(g1 + g7)$.

* * * * *